United States Patent [19]

Giacchetti et al.

[11] 4,405,861
[45] Sep. 20, 1983

[54] SECONDARY-ELECTRON DETECTOR FOR ANALYZING IRRADIATED SAMPLES FOR SCANNING ELECTRON MICROSCOPES AND MICROPROBES

[75] Inventors: Giancarlo Giacchetti, Karlsruhe; Jürgen Ränsch, Munich; Clive T. Walker, Karlsruhe, all of Fed. Rep. of Germany

[73] Assignee: European Atomic Energy Community (Euratom), Plateau du Kirchberg, Luxembourg

[21] Appl. No.: 294,674

[22] Filed: Aug. 20, 1981

[30] Foreign Application Priority Data

Aug. 25, 1980 [DE] Fed. Rep. of Germany ..... 30320139

[51] Int. Cl.³ .............................................. H01J 40/00
[52] U.S. Cl. .................................. 250/305; 250/310; 250/397
[58] Field of Search ............... 250/305, 309, 310, 296, 250/397; 313/359, 361

[56] References Cited

U.S. PATENT DOCUMENTS

| | | | |
|---|---|---|---|
| 3,585,384 | 6/1971 | Castaing et al. | 250/296 |
| 3,937,957 | 2/1976 | Schillalies et al. | 250/305 |
| 4,358,680 | 11/1982 | Read | 250/305 |

*Primary Examiner*—Bruce C. Anderson
*Attorney, Agent, or Firm*—Sughrue, Mion, Zinn, Macpeak and Seas

[57] ABSTRACT

A secondary-electron detector for the analysis of irradiated samples in scanning electron microscopes and microprobes, including an electron collector 12 arranged along a curved or angular path, an electron accelerator 13, a scintillator 24, a light guide 27 and a photomultiplier 28. To enable more effective investigation of irradiated nuclear fuels and to improve the magnification power, a spectrometer 20 and a Wehnelt cylinder 25 are provided between the accelerator and the scintillator.

6 Claims, 1 Drawing Figure

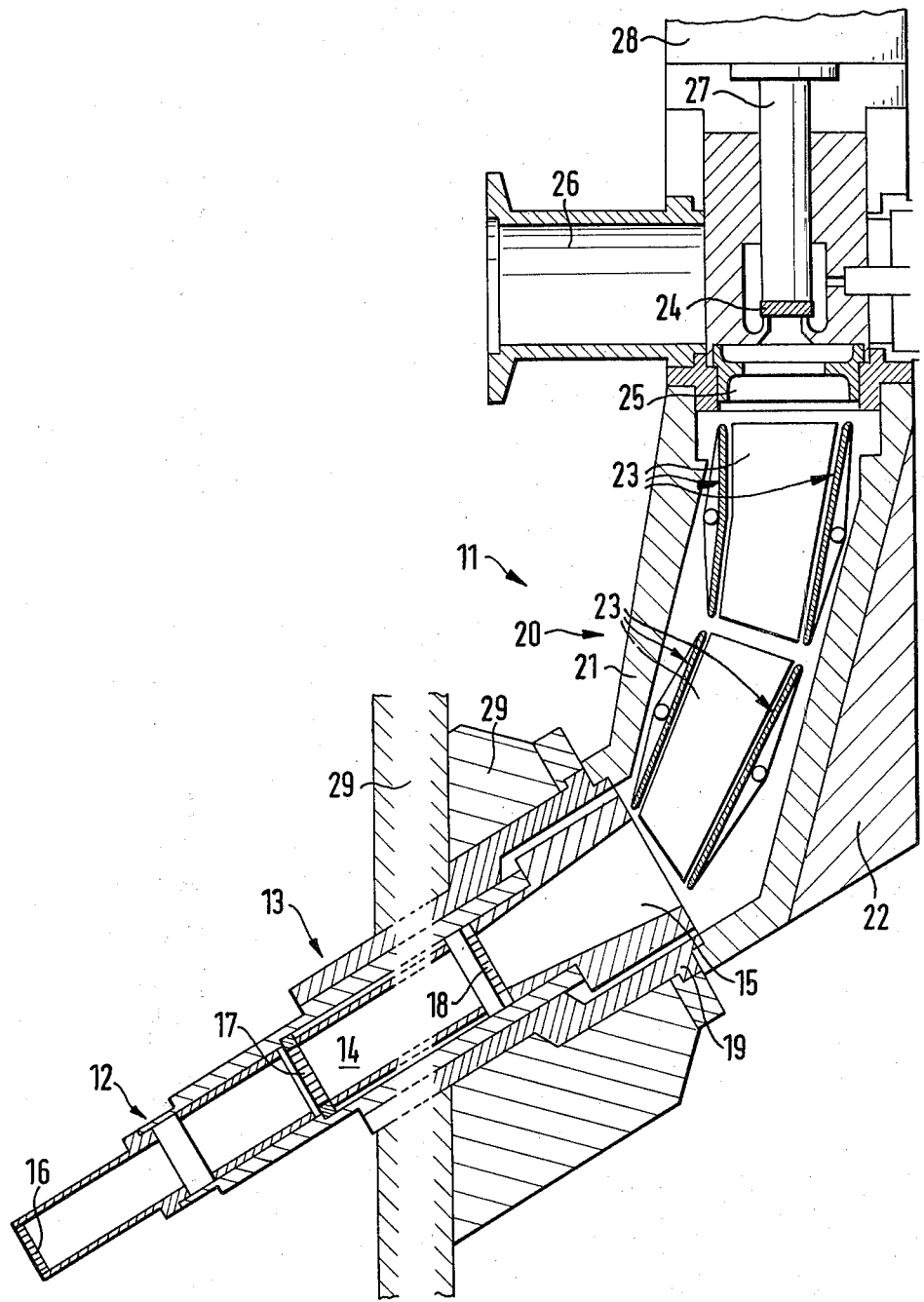

SECONDARY-ELECTRON DETECTOR FOR ANALYZING IRRADIATED SAMPLES FOR SCANNING ELECTRON MICROSCOPES AND MICROPROBES

BACKGROUND OF THE INVENTION

The invention relates to a secondary-electron detector for the analysis of irradiated samples for scanning electron microscopes and microprobes, including an electron collector arranged along a curved or angular path and an electron accelerator, a scintillator, a light guide and a photomultiplier.

If a secondary-electron detector of conventional design is used for the observation of highly radioactive material, for example irradiated nuclear fuel, the surface of the scintillator will be destroyed within a few days. Furthermore, the impact of $\gamma$ rays and high-energy $\beta$ rays on the scintillator and on the dynodes of the photomultiplier (SEM) causes a relatively high level of background noise, whereby clear secondary-electron imaging cannot be achieved.

A secondary-electron detector for shielded scanning electron microscopes and shielded microprobes is known in the prior art, wherein the scintillator, the light guide and the SEM are arranged behind a thick-walled heavy-metal shield to reduce radiation damage, and a curved or angular electron guide tube comprising cylindrical electrodes is used to guide the secondary electrons to the scintillator which is shielded with respect to the sample. The voltage applied to the scintillator, which is in the order of magnitude of 10 kV, is used to separate the secondary electron signal from the background noise. This bias voltage primarily deflects the secondary electrons from their linear trajectory and causes them to impinge upon the scintillator.

This known apparatus has three principal defects. First of all a large part of the electron guidance tube is exposed to the $\beta$ and $\gamma$ rays which impinge upon the electrodes and produce fluorescence electrons, at least some of which intensify the background noise. Secondly, the electron guide tube not only guides secondary electrons to the scintillator but also fluorescence electrons with an energy which is less than the bias voltage of 10 kV, which degrades the signal-to-noise ratio. Finally, the detector is to a large extent endangered by contamination from volatile fission products of irradiated nuclear fuels, for example caesium, and such contamination causes a considerable intensification of the background noise after a relatively short operating time.

SUMMARY OF THE INVENTION

The object of this invention is to improve an apparatus of this type in such a way that it is possible to use scanning electron microscopes or microprobes more effectively and with appreciable efficiency for the investigation of irradiated nuclear fuels, so that, finally, it is possible to attain powers of magnification which are higher than before by a factor of ten. For this purpose it is necessary to devise and use effective means for the discrimination of the secondary-electron signal from the background noise. Moreover, the scintillator has to be protected from radiation damage, without thereby adversely affecting the intensity of the secondary-electron signal.

To achieve this object it is proposed, according to the invention, to improve or modify the secondary-electron detector of the per se known design in such a way that, between the electron accelerator and the scintillator, both an electron spectrometer and a Wehnelt cylinder are provided, whereby it is possible to separate back-scattered electrons and secondary electrons from the fluorescence electrons.

A further improvement results from the measure of providing metal grids at the inlet ends of the electron collector and the accelerator, which ensures a more uniform electric field through which the electrons are accelerated and the losses at the walls of the accelerator are reduced. Preferably, the voltages which can be applied to the electrodes of the collector and the accelerator are adjustable independently of one another, so that in each case the strongest possible secondary-electron signal can be obtained.

BRIEF DESCRIPTION OF THE DRAWINGS

The single drawing FIGURE shows an axial section through a secondary-electron detector constructed in accordance with the teachings of this invention.

DETAILED DESCRIPTION OF THE PREFERRED EMBODIMENTS

The detector 11 has an electron collector 12 at its end nearest the sample, to which an electron accelerator 13 is joined including a first front accelerator stage 14 and a second rear accelerator stage 15. A metal grid 16 is arranged at the inlet end of the electron collector 12; further metal grids 17 and 18 are situated at the inputs of the first and second accelerator stages 14 and 15, respectively. A spectrometer 20 with a housing 21 is flange-mounted at the rear end of a housing 19 of the electron accelerator 13. This spectrometer preferably consists of light metal and is provided with a radiation-protection shield 22 disposed in the axial direction of the collector 12 and accelerator 13. In the housing 21 of the spectrometer 20 two sets of four deflection plates 23 are arranged in tandem. These plate sets are not connected with one another, and adjustable voltage potentials may thus be applied to them. Beyond and between the spectrometer 20 and a scintillator 24 a Wehnelt cylinder 25 is arranged, to which a voltage of about 1.8 kV is applied. A voltage differential of about 10 kV is thus established between the Wehnelt cylinder and the scintillator 24. In order to attain the required vacuum in the detector of about $10^{-5}$ to $10^{-6}$ torr, a connecting socket 26 is provided in the vicinity of the spectrometer and scintillator, which can be attached to a vacuum source. A light guide 27 and a photomultiplier (SEM) 28 are situated behind the scintillator 24.

As is evident from the drawing, the electron accelerator 13 is situated in the shielding wall 29 of the apparatus, whereas the electron spectrometer 20, the scintillator 24, the light guide 27 and the photomultiplier 28 are disposed on the outside thereof where the radiation intensity is only very low.

The secondary-electron detector according to the invention has the following important advantages:

(a) It enables extraordinarily high resolution of the secondary-electron image of highly radioactive material, for example with a $\gamma$ radioactivity of about 0.5 Ci and a $\beta$ radioactivity of about 1.0 Ci, which is above 200 Å, this constituting a considerable improvement in the quality of such images. This depends on the use of a relatively low beam current of about 50–100 pA, which is achieved by the optimum ratio between a high electron signal and a low noise level as a result of the electron spectrometer.

(b) Because of the adjustability of the voltage at the deflection plates of the spectrometers, it is possible to produce images of inactive or radioactive materials also by means of reflected electrons.

(c) Since the vacuum in the spectrometer can be kept to a level of below $10^{-5}$ torr, it is possible to attain a high electron velocity.

(d) Since the essential parts of the detector are disposed outside the shielding of the apparatus and at a sufficient distance from the sample, the scintillator and the SEM are protected not only from radiation but also from contamination by volatile, liberated particles of irradiated nuclear fuel.

What is claimed is:

1. A secondary-electron detector for the analysis of irradiated samples for scanning electron microscopes and microprobes, including an electron collector arranged along a curved or angular path, an electron accelerator, a scintillator, a light guide and a photomultiplier, characterized by: an electron spectrometer (20) and a Wehnelt cylinder (25) disposed between the electron accelerator (13) and the scintillator (24).

2. A detector according to claim 1, wherein the electron spectrometer has at least eight deflection plates (23) arranged in tandem in two sets of four each, to which independently adjustable voltages may be applied.

3. A detector according to claim 2, wherein the deflection plates of the spectrometer comprise material which suppresses the formation of fluorescence electrons, in particular graphite.

4. A detector according to claims 1, 2 or 3, wherein metal grids (16, 17, 18) are individually disposed at inlet ends of the electron collector (12) and individual stages (14, 15) of the electron accelerator, and the potentials applied to the collector and to electrodes of the accelerator are adjustable independently of one another.

5. A detector according to claim 4, wherein inner walls of the electron collector and the electron accelerator are provided with a graphite layer of preferably about 2 mm in thickness.

6. A detector according to claims 1, 2 or 3, wherein the electron spectrometer, the scintillator, the light guide (27) and the photomultiplier (28) are disposed outside a radiation shielding wall (29) of the apparatus.

* * * * *